(12) United States Patent
LaFontaine et al.

(10) Patent No.: US 7,060,401 B1
(45) Date of Patent: Jun. 13, 2006

(54) PHASE-SHIFT REFLECTIVE MASK FOR LITHOGRAPHY, AND METHOD OF USING AND FABRICATING

(75) Inventors: Bruno M. LaFontaine, Pleasanton, CA (US); Adam R. Pawloski, San Jose, CA (US); Yunfei Deng, Berkeley, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 353 days.

(21) Appl. No.: 10/676,923

(22) Filed: Oct. 1, 2003

(51) Int. Cl.
*G01F 9/00* (2006.01)
(52) U.S. Cl. .................................................. 430/5
(58) Field of Classification Search .................. 430/5, 430/322–324; 716/19, 21
See application file for complete search history.

(56) References Cited

U.S. PATENT DOCUMENTS

| | | | |
|---|---|---|---|
| 6,356,340 B1 | 3/2002 | Spence | |
| 6,535,280 B1 | 3/2003 | LaFontaine et al. | |
| 6,555,274 B1 | 4/2003 | Kye et al. | |
| 6,556,286 B1 | 4/2003 | LaFontaine et al. | |
| 6,562,522 B1 * | 5/2003 | Yan | 430/5 |
| 6,645,679 B1 * | 11/2003 | LaFontaine et al. | 430/5 |
| 6,875,543 B1 * | 4/2005 | Chapman et al. | 562/584 |

OTHER PUBLICATIONS

Deng, et al.*Rigorous EM Simulation of the Influence of the Structure of Mask Patterns on EUVL Imaging*, Electronics Research Laboratory and Department of Electrical Engineering and Computer Sciences, University of California at Berkeley, Berkeley, California. Proceedings of the SPIE, vol. 5037, pp. 302-313 (Jun. 2003).

* cited by examiner

*Primary Examiner*—S. Rosasco
(74) *Attorney, Agent, or Firm*—Renner, Otto, Boisselle & Sklar, LLP

(57) ABSTRACT

A reflective reticle includes reflective regions of different phases, with one of the reflective regions being, for example, 180 degrees out of phase with another region. The reflective reticle also includes absorptive regions, which may be placed between reflective regions of opposite phases. The reticle may include a reflector, made up of multiple reflective layers, atop a substrate of absorptive material. The reflector may have some of the reflective areas removed in the phase-shift regions, and substantially all of the reflective layers removed in the absorptive regions. The reticle may allow for greater resolution extreme ultraviolet (EUV) lithography.

37 Claims, 3 Drawing Sheets

PHASE-SHIFT REFLECTIVE MASK FOR LITHOGRAPHY, AND METHOD OF USING AND FABRICATING

BACKGROUND OF THE INVENTION

1. Field of the Invention

The invention relates generally to reflective masks for use in lithography.

2. Background of the Related Art

In the semiconductor field, there has been and continues to be a trend toward smaller devices and higher device densities. This trend shows no signs of abating in the future. Higher densities require the reducing of device sizes and/or distance between devices on semiconductor wafers. In addition, the overall size and/or spacing of interconnects between devices may also need to be reduced.

The trend towards higher device densities leads to a requirement for increased resolution in lithographic process, such as photolithographic processes. Generally speaking, lithography involves any of a variety of processes for transferring patterns between various types of media. With particular regard to semiconductor fabrication processes, a silicon or other semiconductor material may be coated with a resist material that is sensitive to a particular type of radiation. Such coating may be done, for example, by spin coating of the resist material onto the semiconductor wafer. After suitable preparation, a radiation source, such as a light source or source for other types of suitable radiation, may be used to expose selected areas of the resist to radiation. The exposure pattern may be transferred through an intervening mask or reticle, such that the pattern on the mask or reticle is transferred to the resist, either positively or negatively. Exposure to light or other radiation selectively changes the properties of the resist layer during the exposure process. This change in properties can be utilized to selectively expose portions of the underlying semiconductor substrate. For example, exposure may change the solubility of portions of the photoresist to a given solvent. The solvent may then be used to wash away either the exposed or unexposed portions of the photoresist (depending on the type of solvent and the change in solubility caused by exposure to suitable radiation). Thus, the pattern of the mask or reticle may be duplicated, either positively or negatively, in the resist on top of the semiconductor substrate. Suitable operations may be then carried out on the exposed portions of the substrate, such as doping or etching operations.

Photolithography has been and continues to be a useful tool for fabricating semiconductor devices. However, with decreasing feature sizes, resolution requirements have increased to the point that optical systems may no longer be able to achieve the required resolution, due to limits inherently related to the wavelengths of optical light employed in such systems. One possibility of increasing resolution beyond the limits inherent to optical photolithography systems are to utilize shorter-wave length radiation. One specific possibility has been that the use of extreme ultraviolet (EUV) radiation, having wave lengths in the range of about 30 to 700 Angstroms (3–70 nm). Use of EUV radiation allows the possibility of achieving better resolution than in optical photolithography systems. A schematic diagram of a typical EUV lithography system is shown in FIG. 1. The system 100 shown in FIG. 1 generates an image onto a target 102, such as a semiconductor substrate coated with an appropriate resist, from a reflective mask or reticle 104. The transferred pattern may involve a pattern for fabrication directly onto the semiconductor substrate, such as by doping or etching. Alternatively, the pattern may involve other semiconductor fabrication operations, such as fabrication of interconnects on a suitable pattern, for example, to suitably connect together semiconductor devices on the substrate.

A radiation source 108, for example, being a laser source, generates suitable EUV radiation, for example, having a wavelength of about 3 nm to about 70 nm. A condenser 110 may aid in directing the EUV radiation in a desired direction. Optical filtering elements 112, such as lenses or other elements, may also be used in creating a beam of radiation of a suitable size, with a suitable intensity. One or more beams 114 of EUV radiation then impinge upon the reticle 104. The reflective 104 reflects portions of the beams 114, corresponding to the reflective pattern on the reticle 104. The reflective light corresponds to the desired pattern to be exposed on the resist of the target 102. The reflected portion 116 of the beams 114 may then pass through other optical elements, such as mirrors 118, eventually being directed to the target 102.

One difference between the system 100 shown in FIG. 1, and optical systems, is that prior optical systems have generally utilized a mask which selectively allows light to pass through, rather than employing a reflective reticle, such as the reticle 104.

It will be appreciated that the system 100 shown in FIG. 1 is merely a schematic, showing some of the components of a reflective system for patterning using EUV radiation. Other suitable components, such as lenses, slits, or the like, may be utilized in such systems. The system 100 shown in FIG. 1 may be able to achieve a feature resolution better than that which may be had from optical photolithography systems. For example, the system 100 may achieve a feature resolution of 0.18 µm (microns) or less.

Although the general parameters of a reflective system for achieving high-resolution lithography have been set out, it will be appreciated that improvements are desirable in the design of a reflective mask, for example, in order to improve resolution and/or avoid unwanted effects in lithography.

SUMMARY OF THE INVENTION

According to one aspect of the invention, a reflective mask for lithography includes a substrate with a series of reflective layers thereupon. The reflective layers are fully removed to expose the substrate, in a first, absorptive region. The reflective layers are substantially intact in a second, reflective region. The reflective layers are partially removed in a third, phase shift region.

According to another aspect of the invention, a substrate includes reflective material thereupon. The reflective material includes a plurality of reflective layers. The reticle includes reflective regions and phase shift regions. The phase shift regions have some of the reflective layers removed. A transition region exists between parts of the phase shift region and parts of the reflective region, with a sloped interface in the transition region.

According to yet another aspect of the invention, a reflective mask has an absorber region, such as a line, flanked on either side by a reflective region and a phase shift region.

According to still another aspect of the invention, a reflective reticle includes: a first reflective region; a second reflective region; and an absorptive region. The first reflective region and the second reflective region reflect incident coherent radiation out of phase relative to one another. At least part of the first reflective region and at least part of the second reflective region are on respective opposite sides of the absorptive region.

According to a further aspect of the invention, a reflective reticle includes: a substrate that includes an absorptive material; and a reflector on the substrate. The reflector includes a plurality of reflective layers. The reticle includes a first reflective region for reflecting radiation in a first phase. The reticle includes a second reflective region for reflecting radiation in a second phase that is different than the first phase. The reticle includes an absorptive region. The reflector has more of the reflective layers in one of the reflective regions than in the other of the reflective regions.

According to a still further aspect of the invention, a method of fabricating a reflective reticle includes the steps of: depositing a plurality of reflective layers on an absorptive substrate; selectively removing at least some of the reflective layers from parts of the reticle, so as to form: an absorptive region with substantially all of the reflective layers removed; and first and second reflective regions, wherein the first reflective region has more of the reflective layers than the second reflective regions.

According to an aspect of the invention, a method of selectively exposing resist with radiation, includes: 1) directing the radiation at a reflective reticle, wherein the reflective reticle includes: a first reflective region; a second reflective region; and an absorptive region; wherein at least part of the first reflective region and at least part of the second reflective region are on respective opposite sides of the absorptive region; 2) reflecting the radiation off the reflective reticle, wherein the first reflective region and the second reflective region reflect incident coherent light out of phase relative to one another, and wherein the radiation is absorbed by the absorbed region; and 3) directing the radiation reflected off the reticle to the resist.

According to another aspect of the invention, a method of selectively exposing resist with radiation, includes: 1) directing the radiation at a reflective reticle, wherein the reflective reticle includes: a substrate that includes an absorptive material; and a reflector on the substrate; wherein the reflector includes a plurality of reflective layers; wherein the reticle includes a first reflective region and a second reflective region; wherein the reticle includes an absorptive region; and wherein the reflector has more of the reflective layers in one of the reflective regions than in the other of the reflective regions; 2) reflecting the radiation off the reflective reticle, wherein the reflecting includes: reflecting the radiation in a first phase from the first reflective region; and reflecting the radiation in a second phase from the second reflective region; wherein the second phase that is different from the first phase; and wherein the radiation is absorbed by the absorbed region; and 3) directing the radiation reflected off the reticle to the resist.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, which are not necessarily to scale.

DETAILED DESCRIPTION

A reflective reticle includes reflective regions of different phases, with one of the reflective regions being, for example, 180 degrees out of phase with another region. The reflective reticle also includes absorptive regions, which may be placed between reflective regions of opposite phases. The reticle may include a reflector, made up of multiple reflective layers, atop a substrate of absorptive material. The reflector may have some of the reflective areas removed in the phase-shift regions, and substantially all of the reflective layers removed in the absorptive regions. The reticle may allow for greater resolution extreme ultraviolet (EUV) lithography.

Figure 2:
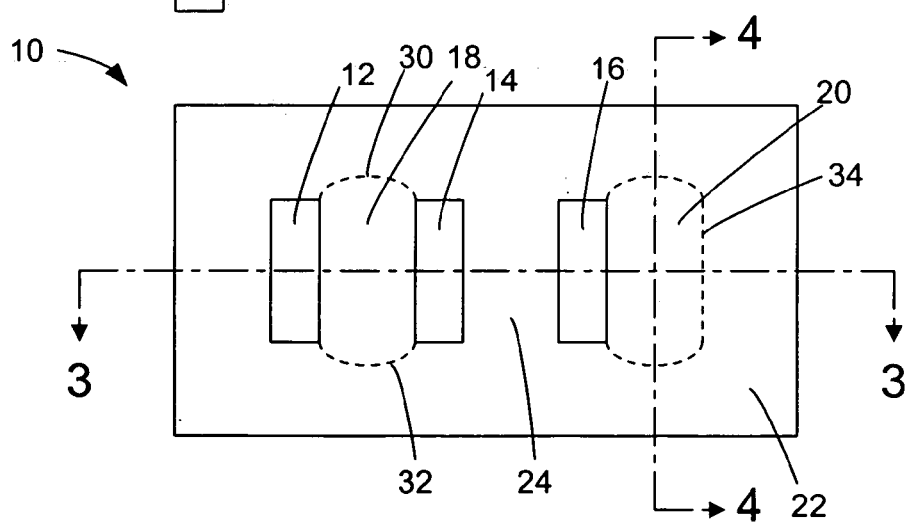
FIG. 2 is a plan view of a reflective reticle in accordance with the present invention.

FIG. 2 shows a reflective reticle 10, such as for use in an EUV lithography system. The reticle 10 includes a pattern thereupon to be transferred to a suitable radiation-sensitive resist. The pattern includes absorber regions 12, 14, and 16. A phase-shift region 18 is located between and bordering or adjoining the absorber regions 12 and 14. A second phase-shift region 20 is located on one side of and bordering or adjoining the absorber region 16. The reticle 10 also includes a reflective region 22, which includes a reflective sub-region 24 (also referred to herein as a reflective region) between and adjoining the absorber regions 14 and 16.

The configuration of absorptive regions, reflective regions, and phase-shift regions on the reticle 10 may be patterned so as to correspond to a desired pattern to be formed on the target, such as a resist layer over a semiconductor substrate. As described further below, the reticle 10 may include reflective material on top of a substrate that is made of material that is absorptive relative to the radiation to be employed, such as EUV radiation.

Having an absorber region such as the absorber regions 12, 14, and 16, flanked on one side by a reflective region, and on the other side by a phase-shift region, advantageously avoids undesirable effects that would result from having the regions on both sides of the absorber region having the same phase.

The phase-shift regions 18 and 20 reflect radiation, which is also referred to herein as light, as does the reflective region 22. However, the phase-shift regions reflect light (radiation) with its phase shifted relative to light reflected by the light reflective region 22. The light reflected by the phase-shift regions 18 and 20 may be about 180 degrees out of phase when compared to light reflected by the reflective regions 22 and 24. This allows for destructive interference between light reflected from the reflective regions 22 and 24, and the phase-shift regions 18 and 20.

It will be appreciated that it may be advantageous to flank the absorber regions on opposite sides with a reflective region and a phase-shift region. Flanking an absorber region with reflective regions on either side that reflect light of the same phase, may result in unwanted exposure in the portion of the target corresponding to the absorber region. With a coherent light source, such as a laser light source, light from both sides of the absorber region would constructively interfere within the target corresponding to the absorber region, for example producing a thin exposed region in a portion of the target for which exposure is not desired.

In contrast, when the regions on either side of an absorptive region are of different phases, the reflective light from both sides of the absorber region may not constructively interfere. When the region on one side of the absorptive region is substantially 180 degrees out of phase with that on the other side of the absorber region, the interference is destructive, causing essentially zero light intensity at the middle of the part of the target corresponding to the absorptive region. Thus, for example, for a series of absorptive lines, such as the absorptive regions 12, 14, and 16, it will be desirable to alternate therebetween different reflective regions that are substantially 180 degrees out of phase. Thus, going from left to right in FIG. 1, one encounters a reflective region, an absorptive region, a phase-shift region (which is reflective but phase-shifted relative to the reflective region), an absorptive region, a reflective region, an absorptive region, a phase-shift region, and another reflective region.

Figure 1:
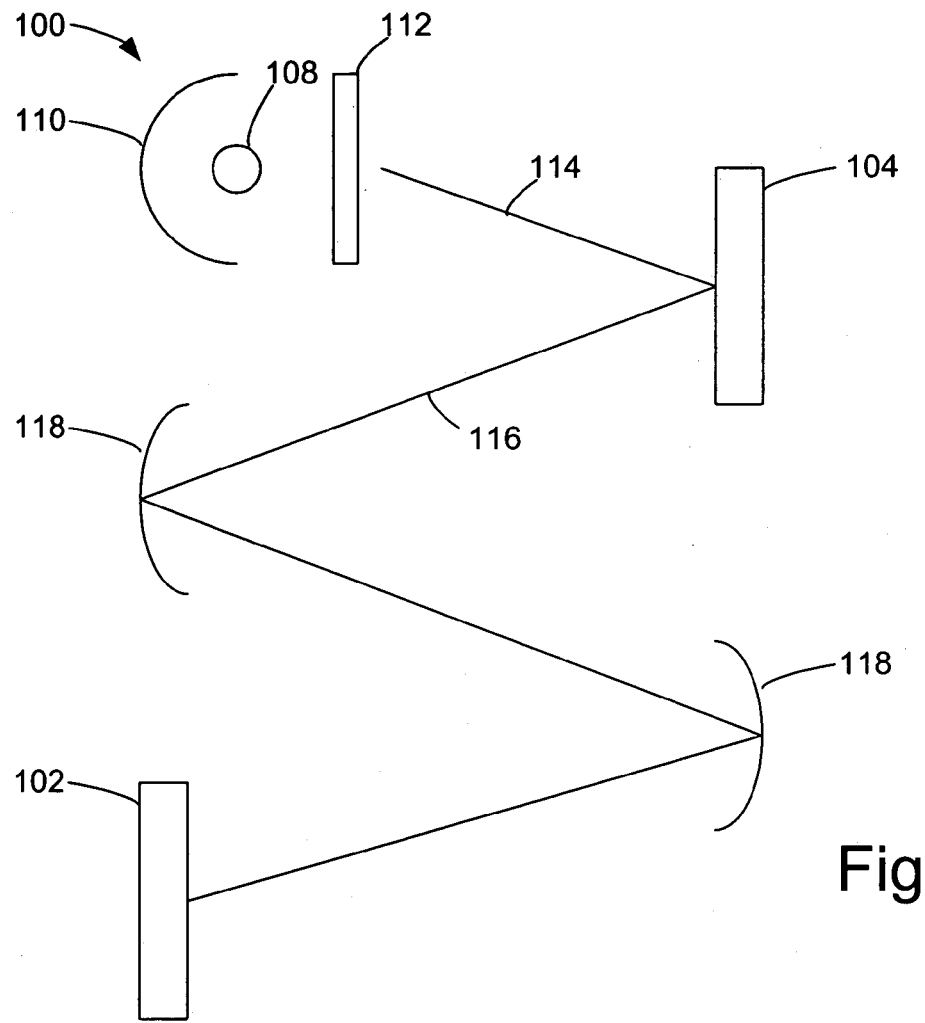
FIG. 1 is a schematic diagram of a prior art lithography system.

The reticle 10 shown in FIG. 1 illustrates a simple example of an absorptive pattern, a series of parallel lines. It will be appreciated that the principles described herein, providing reflective regions of opposite phase on opposite sides of an absorptive region, may be applied to other, more complex, patterns. For example, the more complex patterns may have a wide variety of geometrical shapes, corners, curved and slashed or straight lines, etc.

As explained further below, the transitions between absorptive regions and the adjacent reflective and/or phase-shift regions may be abrupt. However, transitions between the reflective regions and the phase-shift regions may be smoother, occurring over certain distance. For example, there may be transition regions 30 and 32 between the phase-shift region 18 and the reflective region 22. Further, there may be a transition region 34 between the phase-shift region 20 and the surrounding portions of the reflective region 22.

Figure 3:
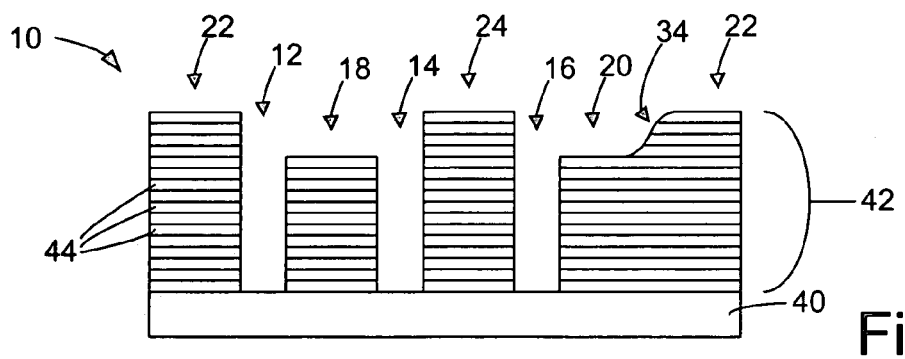
FIG. 3 is a cross-sectional view of the reticle of FIG. 2 along section 3—3 of FIG. 2.
Figure 4:
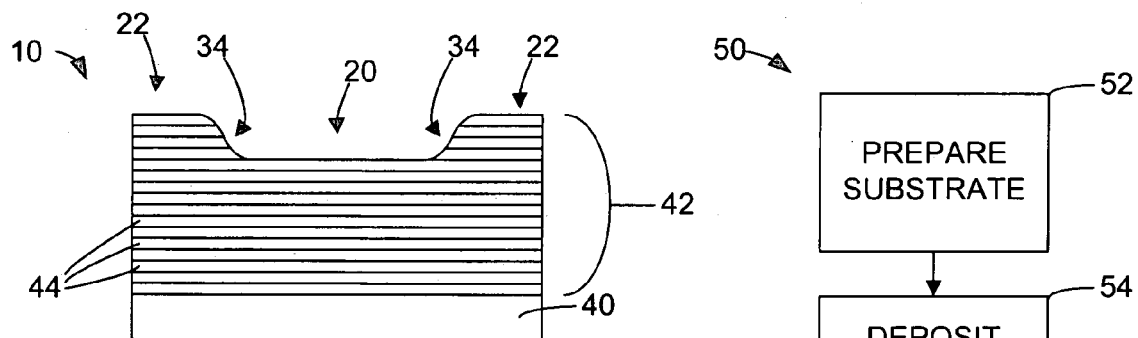
FIG. 4 is a cross-sectional view of the reticle of FIG. 2 along section 4—4 of FIG. 2.

Turning now to FIGS. 3 and 4, details are shown of the layout of the reticle 10. The reticle 10 includes a substrate 40 with a reflector 42 thereupon. The reflector 42 includes a plurality of reflective layers 44, stacked one on top of another upon the substrate 40.

The substrate 40 may be made of a low-thermal-expansion material (LTEM), or another suitable material which absorbs radiation of the desired wavelength. The reflective layers 44 are made of a suitable material which reflects radiation of the wavelength to be employed, for example, a material which reflects EUV radiation.

Examples of a suitable material for the substrate 40 include a material sold under the trademark ZERODUR, marketed by Schott, and a material sold under the trademark ULE, sold by Corning. Another example material for the substrate 40 is a mixed glass composition of approximately 92.6 wt. % $SiO_2$, and 7.4 wt. % $TiO_2$. The substrate 40 may have a low coefficient of thermal expansion, such as from about 5–30 ppb/K. The substrate 40 may be processed to improve its uniformity of thickness and its flatness, for example, by being polished. As noted above, the substrate 40 is substantially absorptive with regard to EUV radiation. However, it may be transmissive to other types of radiation, such as visible light and longer wavelength UV radiation.

The reflective layers 44 may each include molybdenum and silicon, for example, being a single layer of molybdenum coupled to a single layer of silicon. Thus, the reflector 42 may be made up of alternating layers of molybdenum and silicon. Each of the reflective layers 44 may have a thickness of about 7 nanometers, with the molybdenum having a thickness of about 2.8 nm and silicon having a thickness of about 4 nm. The reflector 42 may include from about 40 to about 60 of the reflective layers 44, in areas where some or all of the reflective layers 44 have not been removed. In other areas some or all of the reflective layers 44 may be removed, for example by etching. Thus the reflector 42 may have a maximum total thickness from about 280 nm to about 420 nm.

As another specific alternative, each of the reflective layers 44 may include a layered structure of, in the following order, layers of molybdenum, boron carbide, silicon, and boron carbide.

More broadly, the reflector 42 may include one or more of the following materials, for reflecting EUV radiation: silicon, molybdenum, beryllium, ruthenium, and/or boron carbide. Individual of the reflective layers 44 may have a thickness from about 1–10 nm.

The individual reflective layers 44 may be substantially smooth, uniform in thickness, and free of undesired defects. For example, the variation in thickness between the reflective layers 44 may be relatively small, such as from 0.005 to 0.015 nm.

In the absorptive regions 12, 14, and 16 of the reticle 10, the reflector 42 may be substantially fully removed, to expose parts of the underlying absorptive substrate 40. In the phase-shift regions 18 and 20, some, but not all, of the reflective layers 44 may be removed. This leaves a reflective surface, although a surface at a different height. In the reflective regions 22 and 24 where substantially all of the reflective layers 44 are left intact.

This selective removal of parts of the reflector 42 to create the absorptive regions and the phase-shift regions may be accomplished by suitable etching processes, as described further below. The number of the reflective layers 44 removed to create the phase-shift regions 18 and 20 depends upon the path of the incoming and outgoing light relative to the reticle 10. In one example, about 10 or 11 of the reflective layers 44 (approximately 75 nm of the thickness of the reflector 42), may be removed to create the phase-shift regions 18 and 20. More generally, the thickness of the reflector 42 to be removed may be that required to produce approximately 180 degrees of phase shift. It will be appreciated that the amount to be removed is dependent upon the wavelength of the radiation to be utilized.

In the transition region 34, the reflector 42 is contoured, having a variation in the number of reflective layers 44 removed that varies over some distance D. D may be on the order of approximately 500 nm to a few microns. The transition regions 32 and 34 provide a relatively smooth transition between adjoining phase-shift regions and reflective regions. If there was an abrupt transition between the phase-shift regions and the adjoining reflective regions, there would be an essentially absorptive region at the portion of the target corresponding to the abrupt change. At such an abrupt transition the light would have a zero intensity, being out of phase on either side of the transition. To avoid the undesired non-exposed region on the target, the transition in reflector thickness from the phase-shift regions 18 and 20 to adjoining reflective regions is spread over a distance that is larger than the coherence of the light.

The reflector 42 thus constitutes a plurality of reflective layers 44 that are partially etched to produce the phase-shift regions, and are substantially fully etched down to the substrate 40 to produce the absorptive regions.

In the above description the unetched and partially-etched regions of the reflector 42 have been described as reflective in phase-shift regions, respectively. It will be appreciated that both of these regions are reflective, and that a significant feature is that they are out of phase one relative to the other. Thus, either of the regions may be considered the "reflective region" with the other considered as the "phase-shift region". More broadly, there may be various reflective regions having different phases, the difference in phase being produced by removing different numbers of the reflective layers 44. The embodiment discussed above, where two phases are employed, one 180 degrees out of phase with the other, is but one of a broader set of possible configurations with different phases. For example, regions 90 degrees out of phase with one another may be used in conjunction with suitable patterns to measure lens aberration or focus errors.

The reticle 10 may be used in a lithography system such as the system 100 described earlier. Although the reticle 10 has been described as being suitable for use in EUV lithography, it will be appreciated that such a reflective reticle may be utilized in other lithography systems as well, for example, using other ranges of light wavelength.

Figure 5:
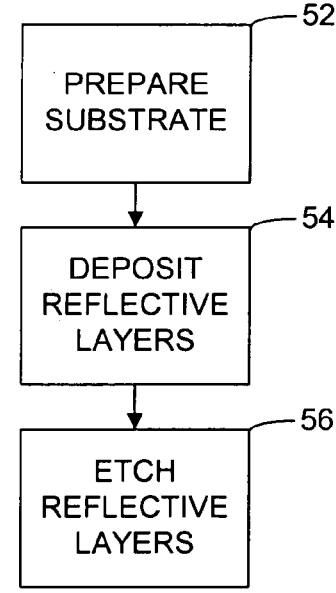
FIG. 5 is a high-level flowchart of a method for fabricating the reticle of FIG. 2.

Turning now to FIG. 5, a high-level flowchart shows some steps of a method 50 for fabricating the reticle 10. In step 52, the substrate 40 is prepared. This preparation may take the form of polishing the substrate to provide a uniform, flat surface. Alternatively, a suitable underlayer may be deposited upon the substrate 40, for example, to provide a surface of uniform flatness.

Figure 6:
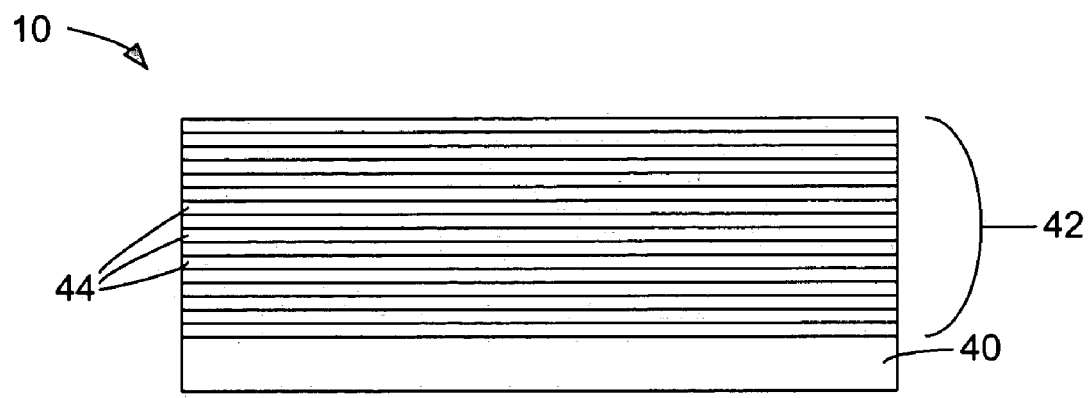
FIGS. 6 and 7 are side cross-sectional views illustrating various steps of the method of FIG. 5.

In step 54, illustrated in FIG. 6, the reflective layers 44 are deposited upon the substrate 40. The reflective layers 44 may be deposited by any of a variety of suitable methods, for example, including sputtering techniques such as magnetron or ion beam sputtering, or vapor deposition techniques such as chemical vapor deposition.

Figure 7:
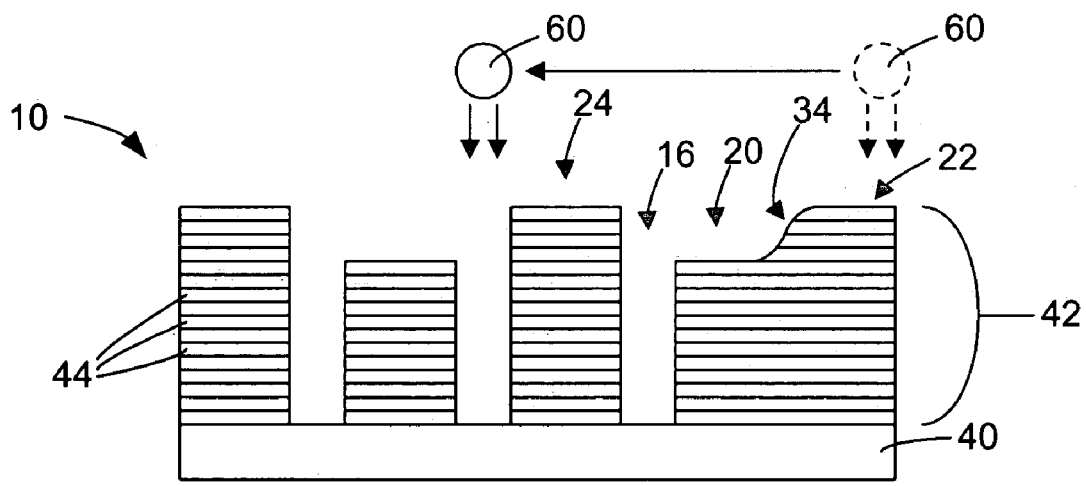

Finally, in step 56 the reflective layers 44 may be suitably etched to form the pattern of absorptive, phase-shift, and reflective regions as desired for the reticle 10. As illustrated in FIG. 7, the etching may be accomplished by suitable etching techniques such as reactive ion etching (RIE) or inductive RF etching. An ion source or RF source 60 may be moved relative to the reticle 10 to suitably etch the reflector 42 to remove the reflective layers 44 as desired. It will be appreciated that the source 60 may be stationary with the reticle 10 moving, or alternatively the reticle 10 may be stationary with the source 60 moving, or there may be some combination of movement of both the reticle 10 and the source 60. The power and/or the duration of the etching for a given region may be varied in order to achieve the desired etching result (no etching at all for the reflective regions, suitable partial etching for the phase-shift regions and the transition regions, and full etching to expose portions of the substrate). As an example, $SF_6$, $CHF_3$ and $O_2$ ions may be used with a RF power of 50 W, a gas pressure of 4.0 Pa and a flow rate of 10 sccm, although it will be appreciated that other ions and/or other parameter values may be used.

It will be appreciated that other etching methods may be employed as suitable. For example, the reflective layers 44 may be coated with a resist material that is selectively exposed and removed, for example, by selective exposure to suitable radiation. The remaining resist may then act as a mask to prevent removal of the reflective layers 44 except where desired. It will be appreciated that such etching may be carried out in a number of steps, for example, using a partial etch step to remove enough reflective layers to produce the phase-shift regions, and a further etching to remove the remaining reflective layer 44 in the absorptive regions.

It will further be appreciated that various types of etching processes may be utilized to achieve the various features of the reflector 42. For example, lithographic etching processes may be utilized to produce the phase-shift and absorptive regions, with a subsequent reactive ion etching used to produce the contours of the transition regions.

It will be appreciated that the transition regions between the absorptive regions and the reflective regions may be curved, so that there is no abrupt transition between a phase shift region in any direction.

It will be appreciated that, for simplicity, the transition regions may be omitted if desired. Such omission of the transmission regions may reduce costs, for example, by allowing less expensive etching techniques to be utilized.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of selectively exposing resist with radiation, the method comprising:
   1) directing the radiation at a reflective reticle, wherein the reflective reticle includes:
      a first reflective region;
      a second reflective region; and
      an absorptive region;
      wherein at least part of the first reflective region and at least part of the second reflective region are on respective opposite sides of the absorptive region;
   2) reflecting the radiation off the reflective reticle, wherein the first reflective region and the second reflective region reflect incident coherent light out of phase relative to one another, and wherein the radiation is absorbed by the absorbed region; and
   3) directing the radiation reflected off the reticle to the resist.

2. The method of claim 1, wherein the first reflective region and the second reflective region reflect radiation substantially 180 degrees out of phase with one another.

3. The method of claim 1,
   wherein the reflective reticle includes:
      a substrate; and
      a reflector on the substrate;

wherein the reflector includes a plurality of reflective layers;

wherein the reflector has more of the reflective layers in one of the reflective regions than in the other of the reflective regions; and wherein at least part of the first reflective region and at least part of the second reflective region are on respective opposite sides of the absorptive region.

4. The method of claim 3, wherein the number of the reflective layers in the transition region varies with location within the transition region; and wherein the transition region borders both of the reflective regions.

5. The method of claim 4, wherein the reflector, within the transition region, has a substantially continuously variable number of the reflective layers.

6. The method of claim 3, wherein the reflector has a total thickness of from about 280 nm to about 420 nm.

7. The method of claim 3, wherein the absorptive region is an exposed part of the substrate, with substantially no reflective material thereupon.

8. The method of claim 1, wherein the radiation includes extreme ultraviolet radiation having a wavelength from about 30 to about 700 Angstroms.

9. A method of selectively exposing resist with radiation, the method comprising:
1) directing the radiation at a reflective reticle, wherein the reflective reticle includes:
a substrate that includes an absorptive material; and
a reflector on the substrate;
wherein the reflector includes a plurality of reflective layers;
wherein the reticle includes a first reflective region and a second reflective region;
wherein the reticle includes an absorptive region; and
wherein the reflector has more of the reflective layers in one of the reflective regions than in the other of the reflective regions;
2) reflecting the radiation off the reflective reticle, wherein the reflecting includes:
reflecting the radiation in a first phase from the first reflective region; and
reflecting the radiation in a second phase from the second reflective region;
wherein the second phase that is different from the first phase; and
wherein the radiation is absorbed by the absorbed region; and
3) directing the radiation reflected off the reticle to the resist.

10. The method of claim 9, wherein the number of the reflective layers in a transition region varies with location within the transition region; and wherein the transition region borders both of the reflective regions.

11. The method of claim 9, wherein the reflector has a total thickness of from about 280 nm to about 420 nm.

12. The method of claim 9, wherein the reflective layers each include a layer of molybdenum joined to a layer of silicon.

13. The method of claim 9, wherein the reflective layers each include a layer of molybdenum and a layer of silicon, with a layer of boron carbide therebetween.

14. The method of claim 9, wherein the substrate includes a low thermal expansion material.

15. The method of claim 9, wherein the absorptive region is an exposed part of the substrate, with substantially no reflective material thereupon.

16. The method of claim 9, wherein the radiation includes extreme ultraviolet radiation having a wavelength from about 30 to about 700 Angstroms.

17. A method of fabricating a reflective reticle, the method comprising:
depositing a plurality of reflective layers on an absorptive substrate;
selectively removing at least some of the reflective layers from parts of the reticle, so as to form:
an absorptive region with substantially all of the reflective layers removed; and
first and second reflective regions, wherein the first reflective region has more of the reflective layers than the second reflective regions.

18. The method of claim 17, wherein the selectively removing includes etching.

19. The method of claim 18, wherein the etching includes reactive ion etching.

20. The method of claim 19, wherein the selectively removing also includes creating a transition region linking the reflective regions;

wherein the transition region has a variable number of the reflective layers; and wherein the variable number is between that of the reflective regions.

21. The method of claim 17, wherein the reflective layers have a total thickness, after the selectively removing, of from about 280 nm to about 420 nm.

22. The method of claim 17, wherein the reflective layers each include a layer of molybdenum joined to a layer of silicon.

23. The method of claim 17, wherein the reflective layers each include a layer of molybdenum and a layer of silicon, with a layer of boron carbide therebetween.

24. A reflective reticle comprising:
a first reflective region;
a second reflective region; and
an absorptive region;
wherein, the first reflective region and the second reflective region reflect incident coherent radiation out of phase relative to one another; and
wherein at least part of the first reflective region and at least part of the second reflective region are on respective opposite sides of the absorptive region.

25. The reticle of claim 24, wherein the first reflective region and the second reflective region reflect radiation substantially 180 degrees out of phase with one another.

26. The reticle of claim 24, wherein the reflective reticle includes:
a substrate; and
a reflector on the substrate;
wherein the reflector includes a plurality of reflective layers;
wherein the reflector has more of the reflective layers in one of the reflective regions than in the other of the reflective regions; and
wherein the reflector includes a transition region in which the reflector has fewer of the reflective layers than in the one of the reflective layers, and in which the reflector has fewer of the reflective layers than in the other of the reflective layers.

27. The reticle of claim 26,
wherein the number of the reflective layers in the transition region varies with location within the transition region; and
wherein the transition region borders both of the reflective regions.

28. The reticle of claim 27, wherein the reflector, within the transition region, has a substantially continuously variable number of the reflective layers.

29. The reticle of claim 26, wherein the reflector has a total thickness of from about 280 nm to about 420 nm.

30. The reticle of claim 26, wherein the absorptive region is an exposed part of the substrate, with substantially no reflective material thereupon.

31. A reflective reticle comprising:
a substrate that includes an absorptive material; and
a reflector on the substrate;
wherein the reflector includes a plurality of reflective layers;
wherein the reticle includes a first reflective region for reflecting radiation in a first phase;
wherein the reticle includes a second reflective region for reflecting radiation in a second phase that is different than the first phase;
wherein the reticle includes an absorptive region; and
wherein the reflector has more of the reflective layers in one of the reflective regions than in the other of the reflective regions.

32. The reticle of claim 31,
wherein the number of the reflective layers in the transition region varies with location within the transition region; and
wherein the transition region borders both of the reflective regions.

33. The reticle of claim 31, wherein the reflector has a total thickness of from about 280 nm to about 420 nm.

34. The reticle of claim 31, wherein the reflective layers each include a layer of molybdenum joined to a layer of silicon.

35. The reticle of claim 31, wherein the reflective layers each include a layer of molybdenum and a layer of silicon, with a layer of boron carbide therebetween.

36. The reticle of claim 31, wherein the substrate includes a low thermal expansion material.

37. The reticle of claim 31, wherein the absorptive region is an exposed part of the substrate, with substantially no reflective material thereupon.

\* \* \* \* \*